United States Patent [19]

Kanazawa

[11] Patent Number: 5,508,612
[45] Date of Patent: Apr. 16, 1996

[54] MAGNETIC RESONANCE IMAGING APPARATUS AND METHOD

[75] Inventor: Hitoshi Kanazawa, Tochigi, Japan

[73] Assignee: Kabushiki Kaisha Toshiba, Kanagawa, Japan

[21] Appl. No.: 309,252

[22] Filed: Sep. 20, 1994

[30] Foreign Application Priority Data

Oct. 14, 1993 [JP] Japan ................................ 5-257045
Aug. 26, 1994 [JP] Japan ................................ 6-202431

[51] Int. Cl.⁶ .................................................. G01V 3/00
[52] U.S. Cl. ................................... 324/309; 324/307
[58] Field of Search ................................ 324/300, 307, 324/309, 310, 311, 312, 313, 314

[56] References Cited

U.S. PATENT DOCUMENTS

| | | | |
|---|---|---|---|
| 4,604,579 | 8/1986 | Cannon et al. | 324/309 |
| 4,893,080 | 1/1990 | Luyten et al. | 324/309 |
| 4,896,112 | 1/1990 | Ratzel et al. | 324/309 |
| 4,986,272 | 1/1991 | Riederer et al. | 324/309 X |
| 5,103,175 | 4/1992 | Kimmich et al. | 324/309 |
| 5,229,717 | 7/1993 | Hinks | 324/309 |
| 5,349,292 | 10/1994 | Sugiura | 324/309 |

OTHER PUBLICATIONS

"Magnetic Resonance in Medicine" vol. 3, 823, 833, 1986 J. Hennig, A. Nauerth, H. Friedburg.

"Proc. Society of Magnetic Resonance in Medicine" No. 1196, 1993 R. T. Constable, R. C. Smith, J. C. Gore.

"Medical Physics" vol. 15, No. 1, pp. 62–63, Jan./Feb. 1988 R. S. Hinks, R. M. Henkelman.

Primary Examiner—Sandra L. O'Shea
Assistant Examiner—Maele Haynes
Attorney, Agent, or Firm—Ronald L. Yin; Limbach & Limbach

[57] ABSTRACT

A magnetic resonance imaging apparatus is provided which generates a plurality of echoes by applying a 90° RF pulse for magnetically exciting spins and subsequently repetitively applying a 180° RF pulse for inverting the phase of the magnetized spin. In this apparatus, a pulse sequence is so performed as to enable any specific interval, out of an interval from the application of a 90° RF pulse until a first echo is obtained and intervals each-between sequential adjacent two echoes, to be made to correspond to a 3 or more odd multiple of any other intervals.

51 Claims, 10 Drawing Sheets

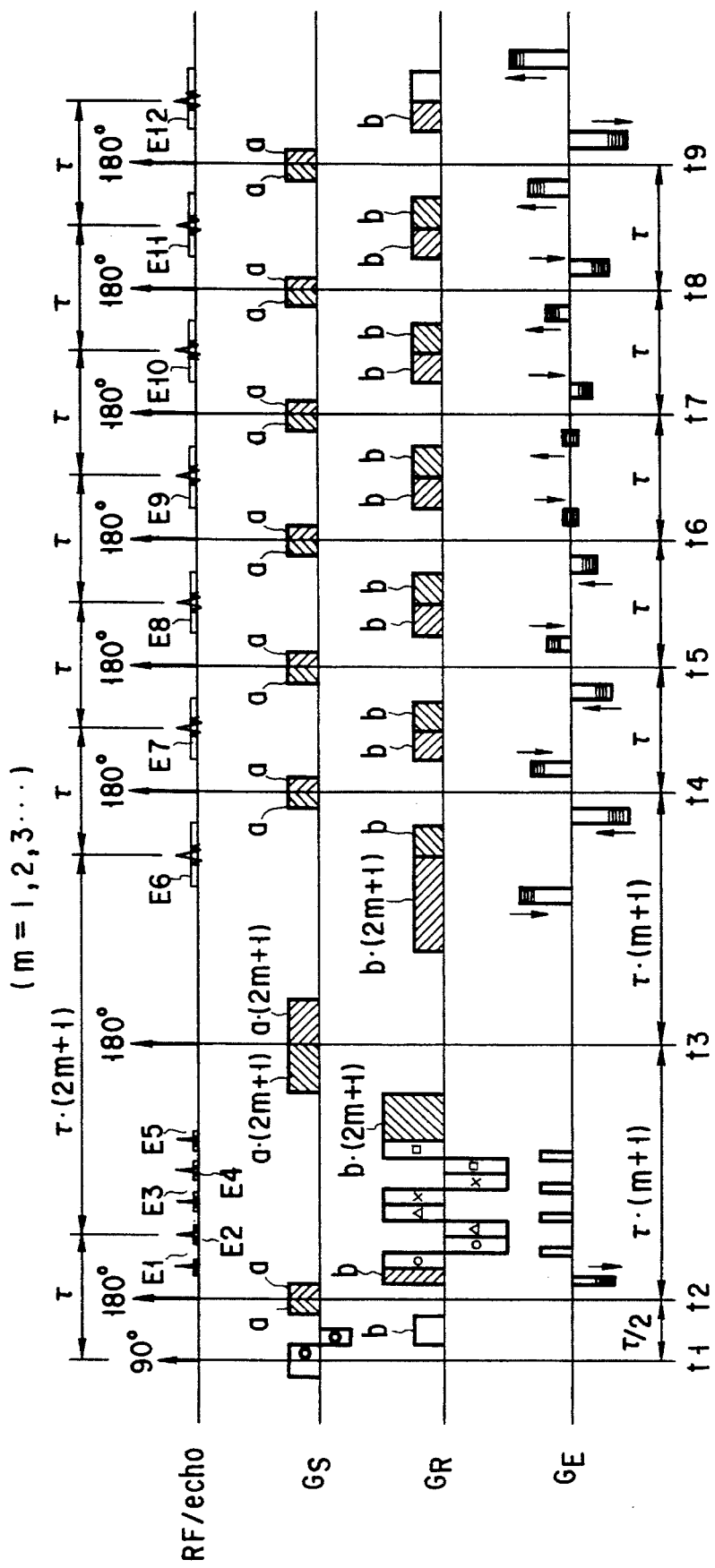
F I G. 11

MAGNETIC RESONANCE IMAGING APPARATUS AND METHOD

BACKGROUND OF THE INVENTION

1. Field of the Invention

The present invention relates to a magnetic resonance imaging apparatus and method for generating a plurality of echoes by applying a 90° RF pulse for magnetically exciting spins and sequentially and repetitively applying a 180° RF pulse.

2. Description of the Related Art

The spin echo imaging (SE) method generates a spin echo on the following principle. After the application of a 90° RF pulse, the spin phases are diffusively varied after a lapse of time. This is called a transverse relaxation phenomenon. When a 180° RF pulse is applied after a lapse of time of $\tau/2$, the phases of respective spins are focused after a lapse of time of $\tau$ from the application of the 90° RF pulse and a transient peak emerges at a free induction decay (FID), thus generating spin echoes.

With the fast spin echo imaging method (hereinafter referred to as an FSE method), a plurality of spin echoes can be obtained by applying a 90° RF pulse and repetitively applying a 180° RF pulse. The FSE method, compared with the SE method, can reduce the application times of the 90° RF pulses drastically. In comparison with the SE method, the FSE method can achieve faster imaging.

The FSE method allows no flexibility upon the designing of a pulse sequence under the following rule. That is, according to the rule above, every interval of a 180° RF pulse can be uniformalized to $\tau$, and the echo time from the application of the 90° RF pulse until a first echo is obtained, as well as every echo interval of those echoes E2, E3, . . . , emerging after the appearance of the first echo, is uniformalized to $\tau$. The rule is based on the following.

It is not possible, in reality, to make a 180° RF pulse have 180° flip angle components only. For this reason, the magnetized spin is dissolved, upon each reception of a 180° RF pulse, into a first component undergoing a phase inversion as expected, a second component undergoing a longitudinal magnetization and a third component undergoing a direct steady phase spread without being given any influence by the 180° RF pulse. The first component emerges as a primary echo, the second component as a stimulated echo and the third component as an indirect echo, by the stimulated echo it is meant an echo generated, through the longitudinal magnetization, after the application of the 90° RF pulse, for example, an echo which, under a varying phase spread of spins along an A-B-E-F path in FIG. 1, is generated when the spin phase focuses at a 0 point. By the indirect echo it is meant an echo generated upon being unusually subjected by a 180° RF pulse to phase inversion, for example, an echo which, under a varying phase inversion along an A-B-D-G-K path, is generated when the spin phase focuses at a 0 point. These stimulated and indirect echoes, together with the primary echo, are effective to composing an image. In order to utilize the stimulated and indirect echoes for composing an image, it has been necessary to generate stimulated and indirect echoes in the same timing as the primary echo and it has, therefore, been necessary to make, constant, all RF pulse intervals and their echo intervals as set out above. Paradoxically, if the stimulated and indirect echoes are generated in a different timing from the primary echo, then this results in their mutual interference and in a poor image quality.

From this situation in which the FSE method, being restricted under the above-mentioned rules, will not allow any flexible pulse sequence, the following disadvantages are reduced. For example, the FSE method enables a plurality of echoes to be obtained in the transverse time T2 and, therefore, the time and interval of an initial echo are shortened compared to the SE method. For a short echo time, there is no decline of a fat signal involved. It is, therefore, not possible, according to the FSE method, to obtain an image of a T2 contrast substantially equal to that obtained according to the SE method. If the echo time is lengthened so as to achieve a decline in the fat signal, subsequent echo intervals are also lengthened, thus resulting in a longer data collection time or in a decline in the number of echoes involved. In order to achieve such a decline in the fat signal without lengthening the echo time and echo interval, the techniques, such as the presaturation processing or the elimination of the fat signal through a chemical shift, have been developed, but there arise the problems with an increase in an SAR (RF exposure), decline in an S/N ratio, decline in the number of echoes resulting from the addition of prepulses, inhomogeneity of a static magnetic field, and so on. These problems must be corrected with high accuracy.

Let it be given that the FSE method and its applied GRASE (gradient and spin echo) method are applied to a dual contrast mode by which it is possible to obtain two kinds of image of different contrast, a proton density weighted image and T2 weighted image, from the first half's echoes and latter half's echoes. In this case, the S/N of the latter half's echoes is lower than that of the first half's echoes in view of its longer relaxation time and the image quality is extremely unbalanced among the images. In order to improve the S/N ratio on the latter half's echoes and eliminate an unbalance among the image quality, it is necessary to lengthen the echo collection time of the latter half's echoes and, by so doing, narrow down the echo collection band. However, the above-mentioned rule does not allow only the echo collection time of the latter half's echoes to be lengthened while the echo collection time of the first half's echoes is reserved in an "as shortened" way.

Let it be given that the first half's echoes and latter half's echoes are collected by the FSE method and GRASE method, respectively. When the FSE method and GRASE methods are used separately, the 180° RF pulses are applied in different time intervals. However, the FSE method and GRASE method, being used in combination, are so uniformalized as to allow the use of a 180° RF pulse interval.

SUMMARY OF THE INVENTION

A first object of the present invention is to provide a magnetic resonance imaging apparatus and method which, through the use of the FSE method, can obtain a T2 contrast image, substantially equal to that by the SE method, while suppressing a fat signal involved.

A second object of the present invention is to provide a magnetic resonance imaging apparatus and method which, in a dual contrast mode for forming two kinds of images, one using a first half's echoes and one using a half's echoes, can reduce an unbalance in quality between these two images.

A third object of the present invention is to provide a magnetic resonance imaging apparatus and method which, in a dual contrast mode for collecting first half's echoes by the FSE method and second half's echoes by the GRASE method, can optimize their 180° RF pulse interval.

According to one aspect of the present invention, there is provided a magnetic resonance imaging apparatus for generating a plurality of echoes by applying a 90° RF pulse for magnetically exciting spins and subsequently repetitively applying 180° RF pulses for inverting the phase of the magnetized spin, comprising:

pulse sequence performing means for performing such a pulse sequence that, one of an interval from the application of a 90° RF pulse until a first echo is obtained and intervals each between sequential adjacent two echoes, is made to correspond to a 3 or more odd multiple of another of intervals; and image forming means for forming an image based on these echoes.

According to another aspect of the present invention there is provided a magnetic resonance imaging method for generating a plurality of echoes by applying a 90° RF pulse for magnetically exciting spins and subsequently repetitively applying 180° RF pulses for inverting the phase of the magnetized spins, comprising the step of performing such a pulse sequence as to enable any specified interval, out of an interval from the application of a 90° RF pulse until a first echo is obtained and intervals each between sequentially adjacent two echoes, to be made to correspond to a 3 or more odd multiple of another of intervals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a view for showing a pulse sequence of an apparatus according to a fourth embodiment of the present invention.

DETAILED DESCRIPTION OF THE PREFERRED EMBODIMENTS

A magnetic resonance imaging apparatus and method will be explained below in conjunction with the embodiments of the present invention, while referring to the accompanying drawings.

(First Embodiment)

Figure 2:
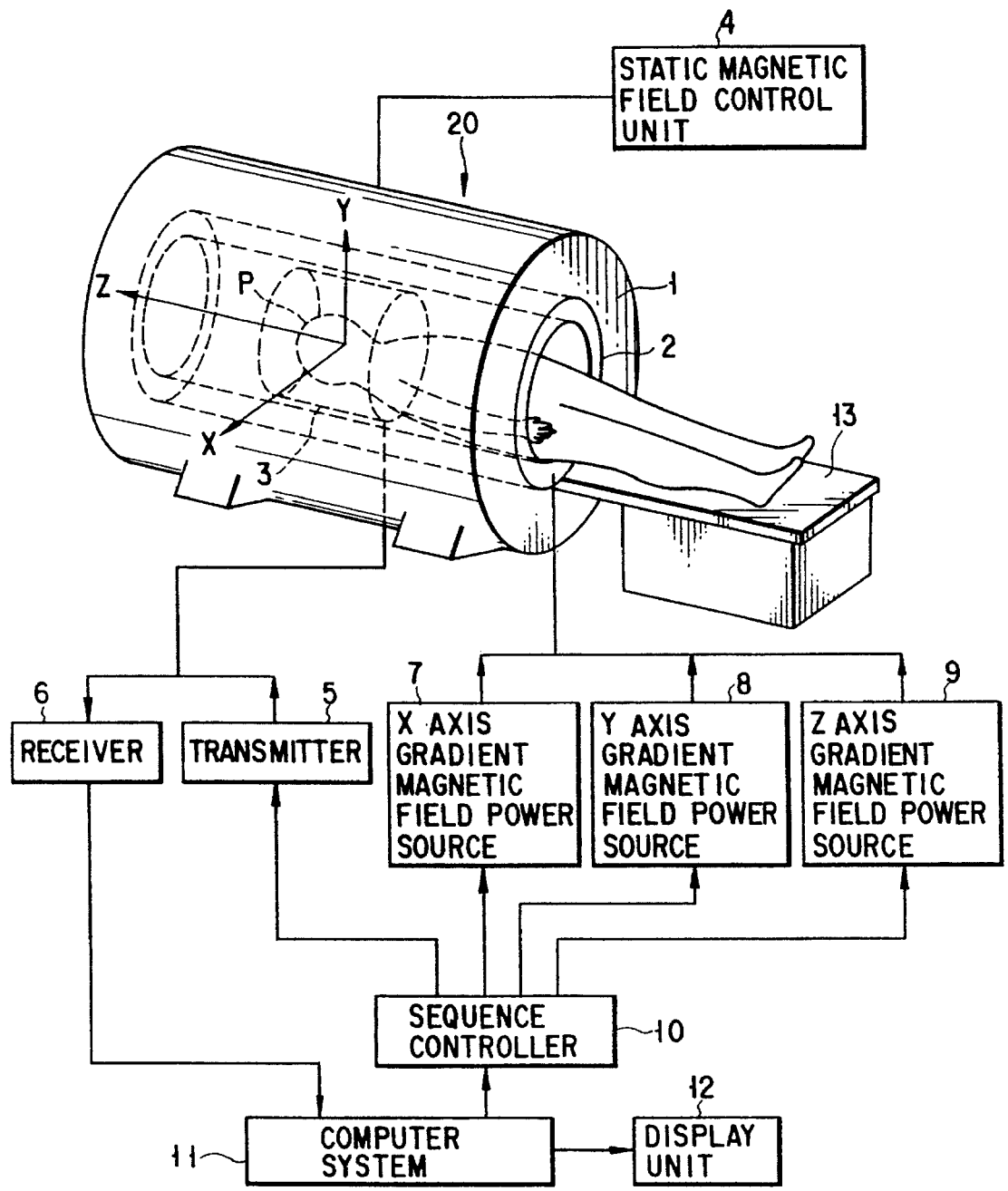
FIG. 2 is a view diagrammatically showing an arrangement of a magnetic resonance imaging apparatus according to a first embodiment of the present invention.

FIG. 2 is a diagram illustrating a magnetic resonance imaging apparatus according to a first embodiment of the present invention. A gantry 20 defines a cylindrical inner space for holding a subject P to be examined and is equipped with a static magnetic field magnet unit 1, gradient magnetic coil 2 and an RF coil 3. The static magnetic field magnet unit 1 is comprised of a permanent magnet, (normal-conducting magnet or super-conducting magnet) and creates a static magnetic field in the cylindrical inner space. Here, for convenience in explanation, the Z axis represents the static magnetic field direction parallel to the body axis of the subject with the x and Y axes normal to the Z axis.

The gradient magnetic field coil unit 2 comprises an x axis gradient magnetic field coil, a Y axis gradient magnetic field coil and Z axis gradient magnetic field coil. The X axis gradient magnetic field coil receives electric current from the X axis gradient magnetic field power source 7 to generate an X axis gradient magnetic field whose intensity varies along the X axis. The Y axis gradient magnetic field coil receives electric current from a Y axis gradient magnetic field power source 8 to generate a Y axis gradient field whose intensity varies along the Y axis. Upon receipt of electric current from the Z axis gradient magnetic field power source 9, the Z-axis gradient magnetic field coil generates a Z axis gradient magnetic field whose intensity varies along the z axis. For convenience in explanation, it is assumed that the X, Y and Z axis gradient magnetic fields are used for a read gradient magnetic field GR, phase encode gradient magnetic field GE and slice gradient magnetic field GS, respectively. It is possible to collect data in a range in which the intensities of the X, Y and Z axis magnetic fields are linearly varied. The range above is referred to as an image obtainable region. Upon data collection, the subject can be inserted into the image obtainable region in such a state that the subject is held on a top surface of a bed 13.

A transmit/receive coil 3 is connected to a transmitter 5 at the time of excitation and to a receiver at the time of reception. The transmit/receive coil 3 receives electric current from the transmitter 5 to generate a selective excitation pulse of a predetermined frequency component. A plurality of spins are magnetically excited, in a selective fashion, in a Z position corresponding to the frequency component above. This is called a selective excitation method. A magnetic resonance signal (hereinafter referred to as an echo) is generated from the relaxing magnetized spins, after excitation has been completed, and sent to the transmit/receive coil 3.

A sequence controller 10 performs a later-described pulse sequence by controlling the respective operation timings of the X axis gradient magnetic field power source 7, the Y axis gradient magnetic field power source 8, the Z axis gradient magnetic field power source 9, the transmitter 5 and the receiver 6. A computer system 11 controls the whole operation of the system and forms a slice image by picking up echoes from the transmit/receive coil 3 through the receiver 6. The slice image is displayed on a display unit 12.

The operation of the present embodiment will be explained below.

Figure 3:
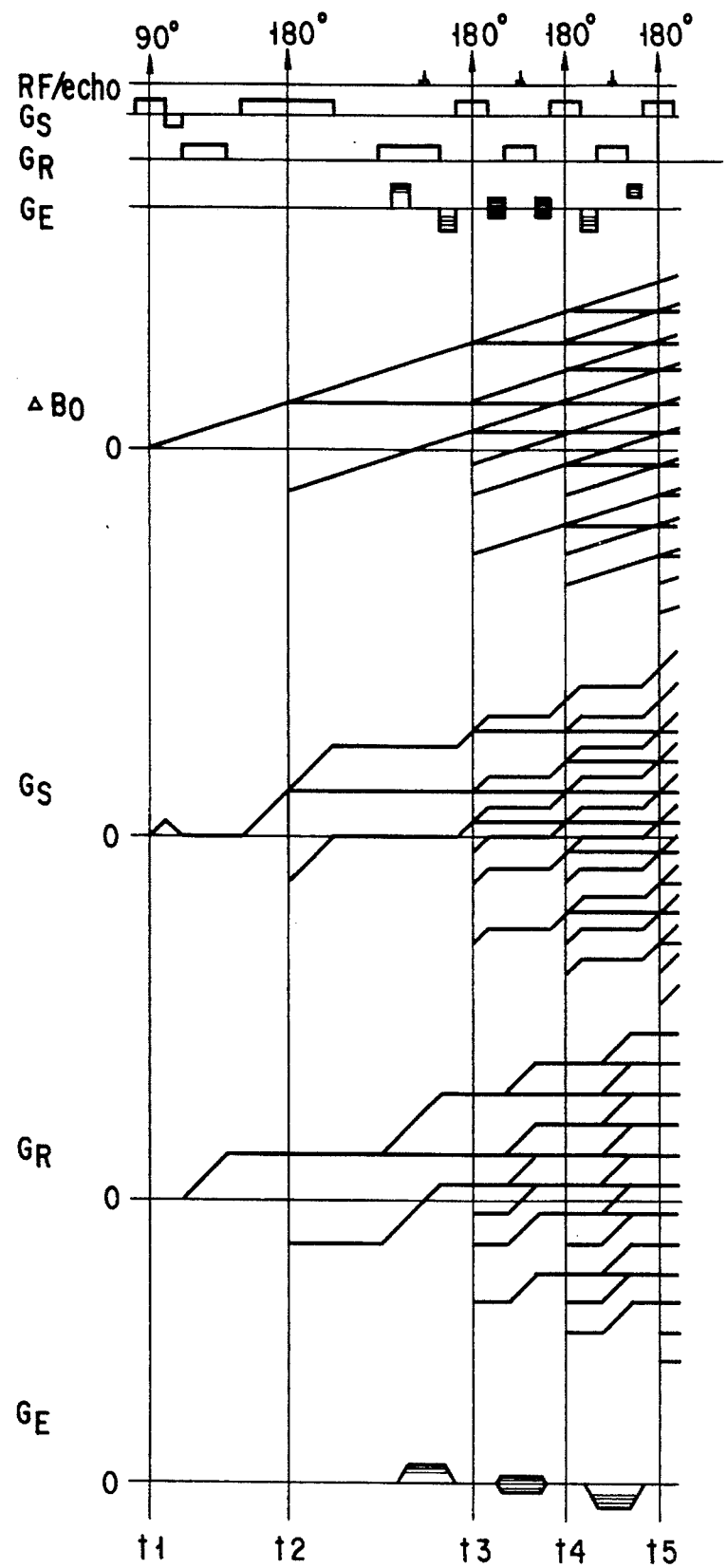
FIG. 3 is a view showing a pulse sequence of the apparatus of the first embodiment.
Figure 4:
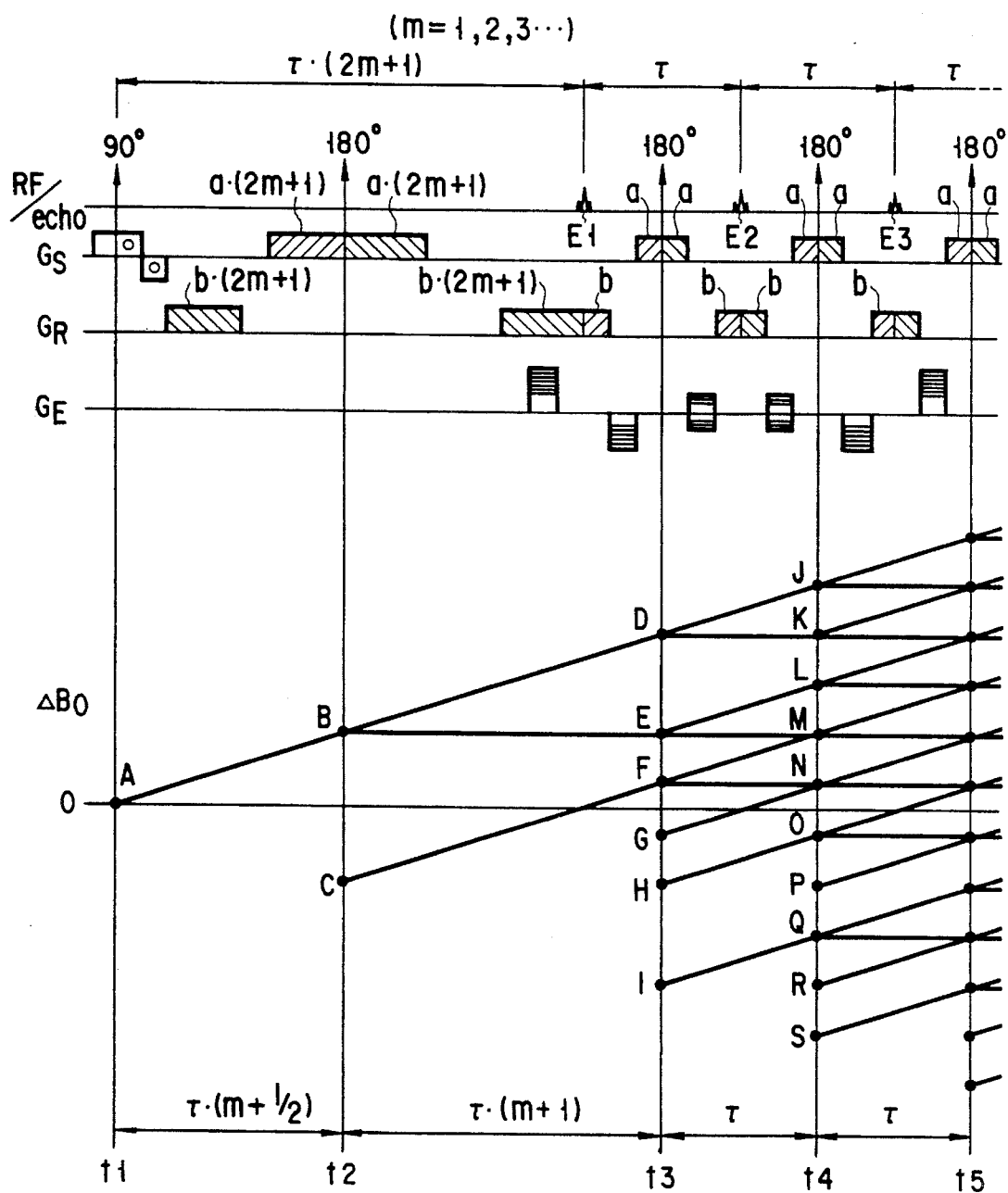
FIG. 4 is a detailed view showing a pulse sequence of the apparatus of the first embodiment.

FIG. 3 is a phase diagram representing, as a model, a temporal variation in the phase spread of the magnetized spin by a pulse sequence unique to the present embodiment. FIG. 3 shows the temporal variation of the phase spread on the static magnetic field's inhomogeneity $\Delta B_O$, slice direction gradient magnetic field $G_S$, read direction gradient magnetic field $G_R$ and phase encode direction gradient magnetic field $G_E$. What is relevant to the present invention is a temporal variation in the phase spread by the inhomogeneity of the static magnetic field. FIG. 4 shows, in detail, the temporal variation in the phase spread by $\Delta B_O$ as well as the pulse sequence of FIG. 3.

Even in the improved FSE method of the present embodiment, after a 90° RF pulse has been applied, a 180° RF pulse is applied a predetermined N number of times to obtain a plurality of echoes, that is, an N number of echoes. This is not different from a conventional FSE method. The way of making the interval of any two of sequential echoes E1, E2, E3, . . . , EN a uniform time τ is also not different from the conventional FSE method.

With the conventional FSE method, the time interval (interval: E1 echo time) taken from the application of a 90° RF pulse until a start echo E1 is obtained, has been set to be the same as the echo interval τ. With the present embodiment, the E1 echo time is extended under the condition that it is set to be equal to a 3 or more odd multiple of its echo time interval τ. That is, the E1 echo time TE1 is represented by $$TE1 = \tau \cdot (2m+1) \qquad (1)$$

noting that m denotes an integer of 1 or more. By extending the E1 echo time, the extent to which a fat signal declines is greater than that according to the conventional FSE method of setting the E1 echo time equal to the echo interval. In consequence, the contrast of an image according to the improved FSE method of the present invention is more approximate to the contrast of an image by an ordinary SE method than that by the conventional FSE method.

The E1 echo time is preferably made short, taking into consideration the need to shorten the imaging time and obtain a large number of echoes. It is, therefore, ideal to set the E1 echo time equal to three times the echo interval, that is, m=1. The experiments conducted show that, even when the E1 echo time is fixed to three times the echo interval, it is possible to obtain an image whose contrast is substantially the same as that by the ordinary SE method.

In order to satisfy the condition of Equation (1) for m=3, a 90° RF pulse is applied wherein, after a lapse of time of τ · (m+½), a first 180° RF pulse is applied, which is followed by the application of a second 180° RF pulse after an additional lapse of time of τ · (m+1). Then a sequence of 180° RF pulses at an interval is repeatedly applied a predetermined number of times. Stated in another way, the interval between the first 180° RF pulse and the second 180° RF pulse is set to be a 2 or more integral multiple of the third or subsequent 180° RF pulse interval τ, namely, τ · (m+1).

It is required that, in order to make the E1 echo time correspond to a three or more odd multiple of the echo interval, the slice gradient magnetic field $G_S$ and read gradient magnetic field $G_R$ be adjusted as will be set out below.

The area of the slice gradient magnetic field $G_S$ applied together with the initial 180° RF pulse, that is, the intensity of the magnetic field X application time (time integral value), is made to correspond to a 3 or more odd multiple of a time integral value (2 · a) of the slice gradient magnetic field $G_S$ applied together with the second and subsequent 180° RF pulses which is expressible as 2a · (2m+1). Put it in another way, the time integral value of the slice gradient magnetic field $G_S$ applied between the first 180° RF pulse and the second 180° RF pulse is made to correspond to a 2 or more integral multiple of the time integral value of the slice gradient magnetic field $G_S$ applied between the second and subsequent adjacent 180° RF pulses. In order to obtain the time integral relation as set out above, the time of the slice gradient magnetic field $G_S$ applied together with the first 180° RF pulse is made to correspond to a 3 or more odd multiple of the application time of the slice gradient magnetic field $G_S$ applied together with the second or sequential 180° RF pulse, provided that, as shown in FIG. 4, the intensity of the magnetic field, that is, the gradient of the magnetic field, is made constant. However, the intensity of the slice gradient magnetic field $G_S$ applied together with the first 180° RF pulse may be made to correspond to a 3 or more odd multiple of the slice gradient magnetic field $G_S$ applied together with the second or sequential 180° RF pulse, provided that the application time is constant.

An echo is read out in the presence of the read gradient magnetic field $G_R$ so as to secure an alignment in the read direction, that is, in the X direction. The area of the read gradient magnetic field $G_R$ applied at a time of the first echo E1, that is, the magnetic field intensity X application time (time integral value), is made to correspond to a 2 or more integral multiple of a time integral value 2 · b of the read gradient magnetic field $G_R$ applied at a time of reading out the second or sequential echoes E2, E3, . . . , which is expressible as 2 · b · (m+1). In order to obtain the time integral relation as set out above the application time of the read gradient magnetic field $G_R$ applied together with the first echo E1 is made to correspond to a 2 or more odd multiple of the application time of the read gradient magnetic field $G_R$ applied at a time of reading out the second or sequential echoes E2, E3, . . . , provided that, as shown in FIG. 4, the magnetic field intensity, or the magnetic field gradient, is constant.

Provided that the interval from the application of the 90° RF pulse until the first echo E1 is obtained is made to correspond to a 3 or more odd multiple of the echo interval of the second or subsequent echoes E2, E3, . . . , the above interval taken is extended and, by so doing, a stimulated echo or indirect echo is generated in the same timing as that of a primary echo so that it is utilizable to construct an image.

In reality, it is not possible for the 180° RF pulse to have only 180° flip angle components. Upon receipt of each 180° RF pulse, the magnetized spin is resolved into a first component undergoing a phase inversion as predicted, a second component undergoing a longitudinal magnetization and a third component undergoing its steady phase spread as it is without being affected by the 180° RF pulse. The first component is generated as a primary echo, the second component as a stimulated echo and the third component as an indirect echo. The stimulated echo is one which is generated via the longitudinal magnetization after the application of the 90° RF pulse. The stimulated echo is generated when, through a varying spin phase spread along an A-B-E-H-O path in FIG. 4 for instance, the spin phase passes through its focusing point O. The indirect echo is one which occurs when it encounters an unusual (a not steady) phase inversion by the 180° RF pulse. For example, the indirect echo is generated when, through a varying spin phase spread along an A-B-D-I-Q path, the spin phase passes through its focusing point O.

Figure 1:
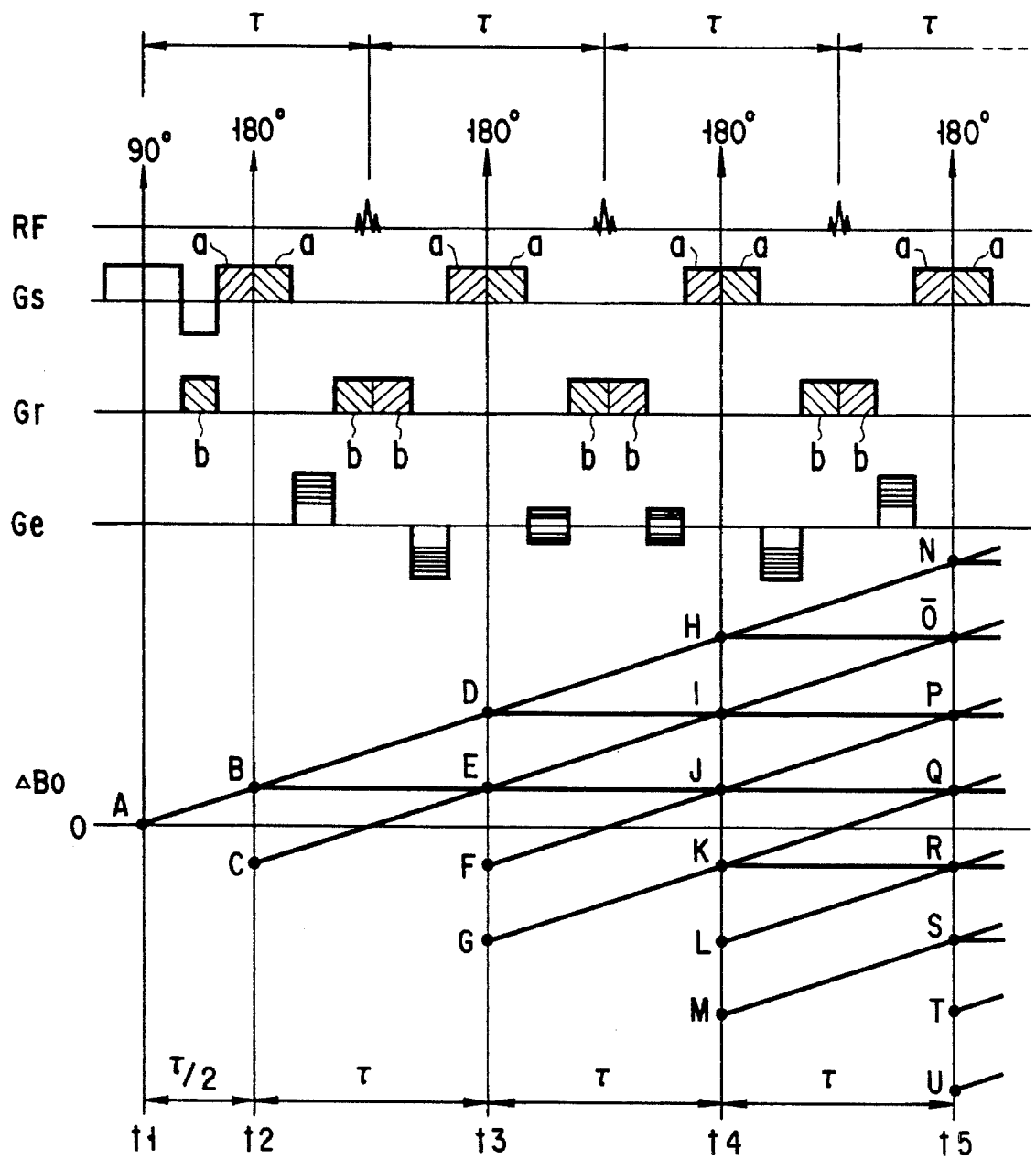
FIG. 1 is a phase diagram on a $\Delta B_O$ corresponding to the pulse sequence of a conventional FSE method.

An explanation is given below of the principle on which the stimulated and indirect echoes can be generated in the same timing as that of the primary echo by extending the interval from the application of the 90° RF pulse until the first echo E1 is obtained, provided that the above interval is made to correspond to a 3 or more odd multiple of the echo interval of the second or sequential echoes E2, E3, . . . . Reference is made to the pulse sequences of FIGS. 1 and 4 for comparison. For convenience in explanation, let it be assumed that m=1. In the pulse sequence of the present embodiment, the application timing of the 180° RF pulse is equivalent to eliminating the first and third 180° RF pulses in the pulse sequence shown in FIG. 1. The interval of the 180° RF pulse of the pulse sequence in FIG. 1 is so adjusted that stimulated and indirect echoes are generated in the same timing as the primary echo. The phase spread of the stimulated echo, indirect echo and primary echo are made constant irrespective of the 180° RF pulse. That is, the phase diagram of FIG. 4 is so considered that, in the phase diagram shown in FIG. 1, those magnetized spins by the first and third 180° RF pulses are not resolved into three components. Therefore, so long as the condition is obeyed that the interval from the application of the 90° RF pulse until the start echo E1 is obtained is made to correspond to a 3 or more odd multiple of the echo interval of the second and sequential echoes E2, E3 . . . . , the stimulated and indirect echoes can be generated in the same timing as that of the primary echo.

According to an improved FSE method of the present invention, it is possible to obtain an image whose contrast is equal to that of an image obtained by the ordinary SE method.

(Second Embodiment)

Figure 8:
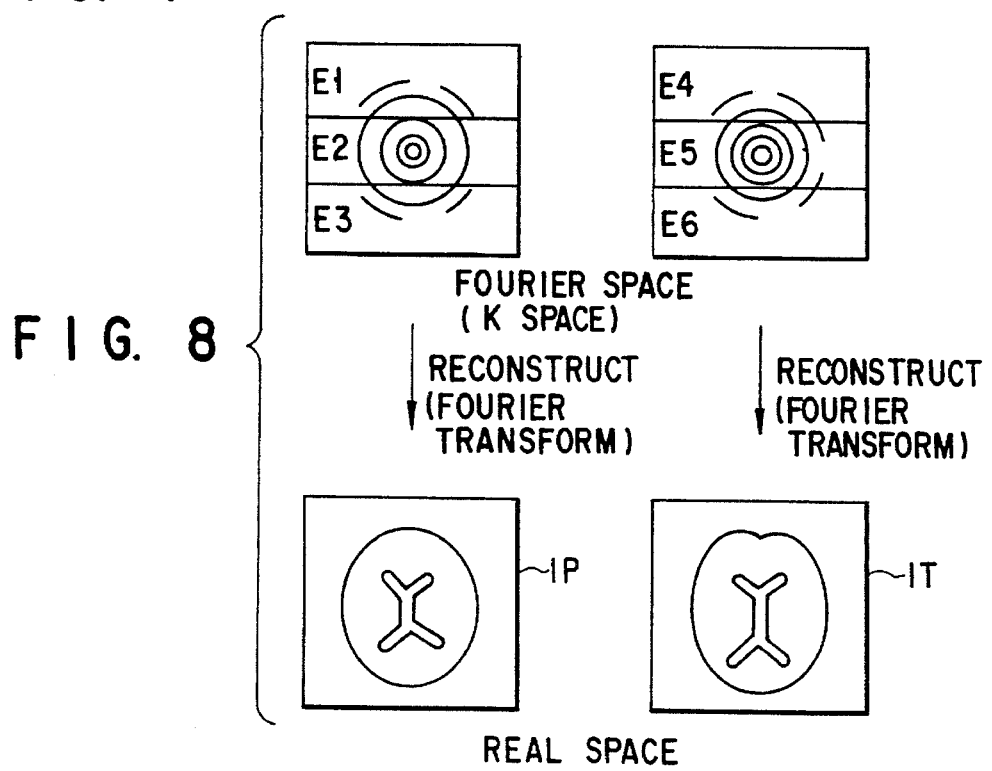
FIG. 8 is a view showing the allocation of echoes to two images to be formed by the apparatus.

The second embodiment is similar to the first embodiment with respect to their arrangements and any detailed explanation of its arrangement is omitted for brevity's sake. The second embodiment relates to an improved FSE method as applied to a dual contrast mode. As shown in FIG. 8, in a dual contrast mode, a proton density image IP is formed at the first half's echoes E1 to E3 and a $T_2$ enhanced image $I_T$ is formed at the latter half's echoes E4 to E6 of those echoes E1 to E6 obtained by the first 90° RF pulse.

The condition that the E1 echo time of the first embodiment is extended to a 3 or more odd multiple of the echo interval can be exchangeably read as the condition that a specific echo interval is extended to a 3 or more odd multiple of another echo interval. The second embodiment corresponds to an improved FSE method applied to the dual contrast mode under the latter condition so read.

Figure 5:
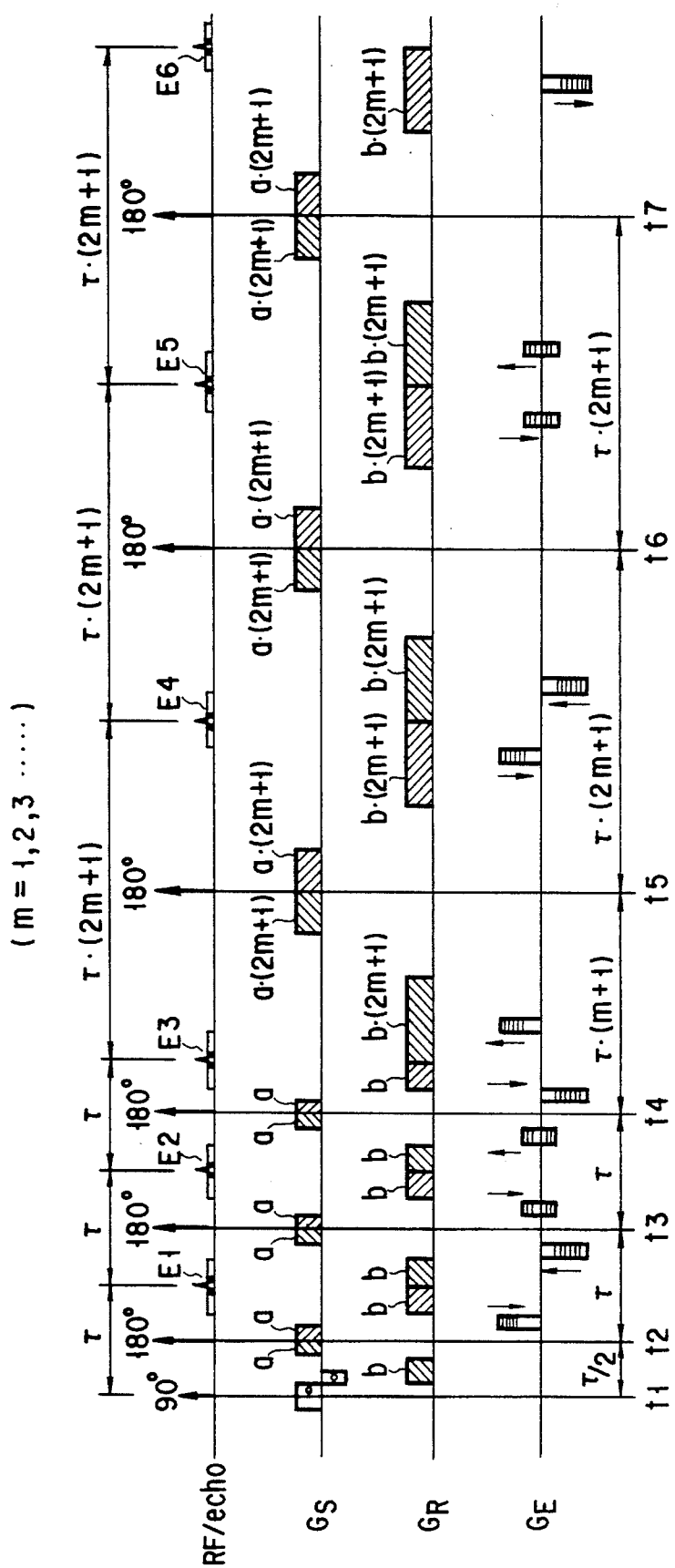
FIG. 5 is a view showing a pulse sequence of an apparatus according to a second embodiment of the present invention.
Figure 7:
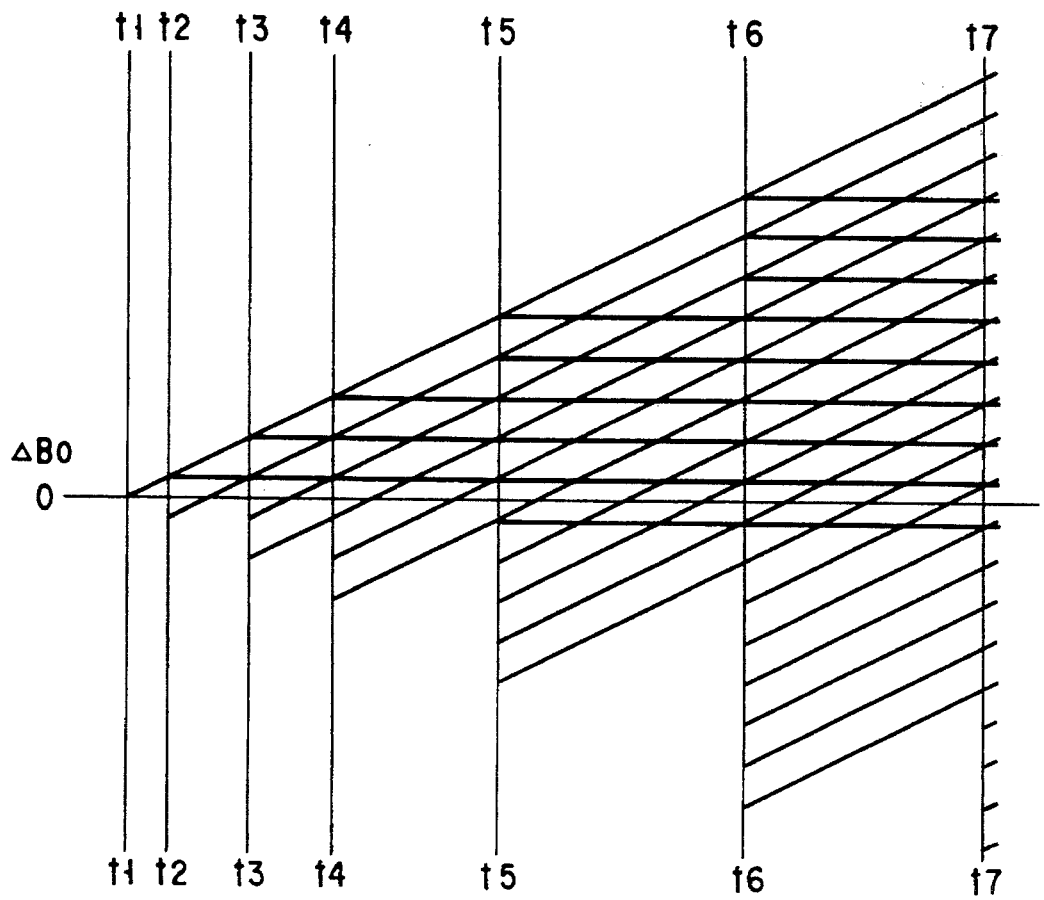
FIG. 7 is a phase diagram relating to a $\Delta B_O$.

FIG. 5 shows a pulse sequence in which, under the condition above, the echo interval at the latter half portion above is extended to a 3 or more odd multiple, that is, $\tau \cdot (2m+1)$, of the echo interval $\tau$ at the first half portion as set out above. This pulse sequence is shown in the phase diagram of FIG. 7.

As shown in FIG. 5, the interval of the 180° RF pulse at the latter half portion is extended to a 3 or more odd multiple, that is, $\tau \cdot (2m+1)$, of the 180° RF pulse at the first half portion. This makes it necessary for the slice gradient magnetic field $G_S$ and read gradient magnetic field $G_R$ to be set as will be set out below. The time integral value of the slice gradient magnetic field $G_S$ applied together with the 180° RF pulse at the latter half portion is made to correspond to a 3 or more odd multiple, that is, $2 \cdot a \cdot (2m+1)$, of the time integral value of the slice gradient magnetic field $G_S$ applied together with the 180° RF pulse at the first half portion. Further, the time integral value of the read gradient magnetic field $G_R$ applied upon the reading of the echoes E4, E5 and E6 at the latter half portion is made to correspond to a 3 or more odd multiple, that is, $2 \cdot b \cdot (2m+1)$, of the time integral value of the read gradient magnetic field $G_R$ applied upon the reading of the first half's echoes E1 and E2.

Figure 6:
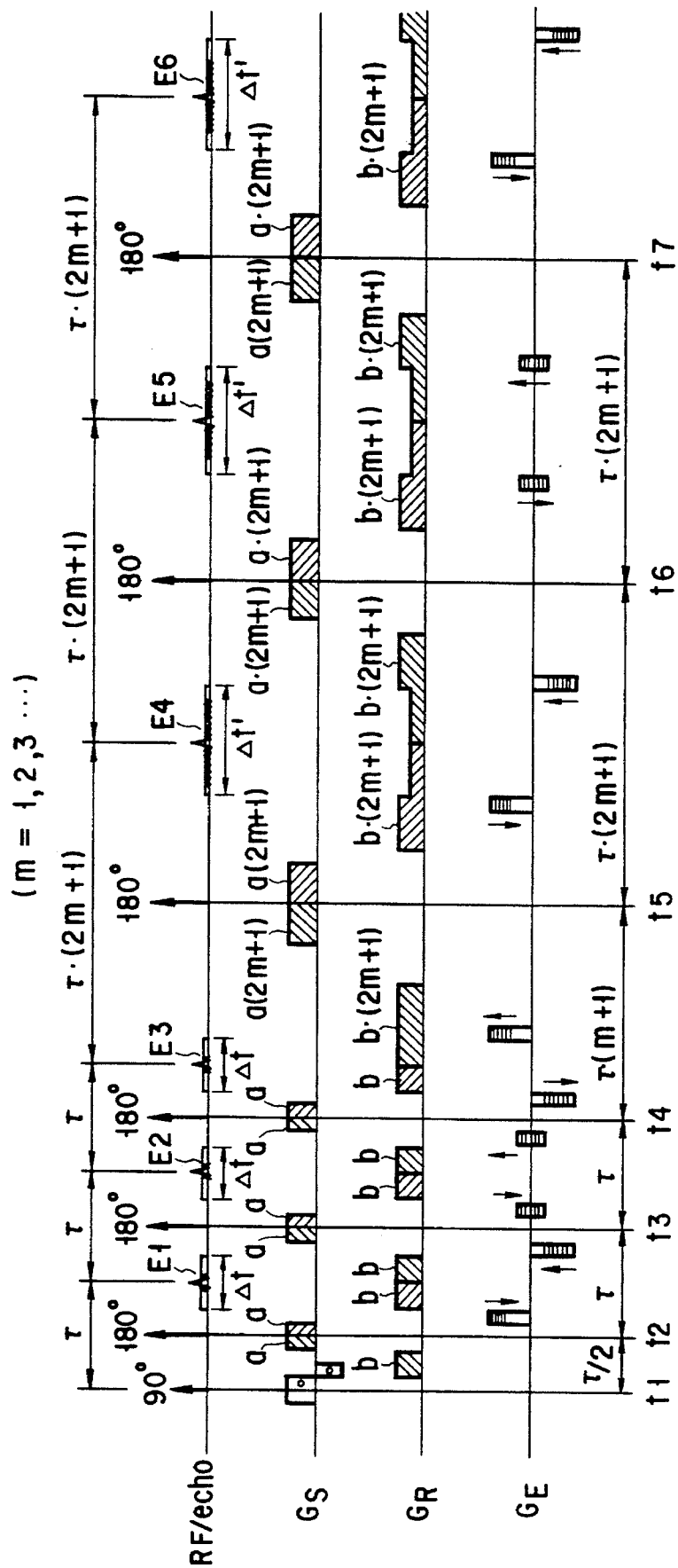
FIG. 6 is a view showing an improved pulse sequence of FIG. 5.

In the second embodiment, the pulse sequence of FIG. 5 can be improved upon as shown in FIG. 6. Since the latter half's echo interval can be extended to $\tau \cdot (2m+1)$ with respect to the first half's echo interval $\tau$, a data collection time $\Delta t'$ of the latter half's echoes is made longer than the data collection time $\Delta t$ of the first half's echoes with the aforementioned time integral relation reversed and the echo collection band is narrowed down so that a S/N difference between the first half's echoes and the latter half's echoes is decreased. By so doing, it is possible to alleviate an unbalance between a proton density weighted image IP at the first half portion and a $T_2$ weighted image IT at the latter half portion. Further, the time length of the latter half's echoes is greater than that of the first half's echoes and, without varying a sampling frequency for those echoes at the first and latter half portions, it is possible to enhance the resolution, relative to a read direction (X direction), of the $T_2$ weighted image IT at the latter half portion.

(Third Embodiment)

The third embodiment is similar to the first embodiment with respect to their structures and an explanation of these is omitted for brevity in explanation with the third embodiment, the first half's echoes are collected by the FSE method, and the latter half's echoes by the GRASE method, in a dual contrast mode. The GRASE method is an ultra-high speed imaging method by which, through the application of a 90° RF pulse and then the repetitive application of 180° RF pulses, echoes are repetitively generated between the adjacent 180° RF pulses while the read gradient magnetic field $G_R$ is reversed. In this connection it is to be noted that, under the conventional rule of the 180° RF pulse interval being constant, there is no proper time for those echoes to be repetitively generated between those adjacent 180° RF pulses while reversing the read gradient magnetic field $G_R$. It has been, therefore, very difficult to combine the FSE method with the GRASE method.

Since, as set out in conjunction with the second embodiment, the interval of the latter half's 180° RF pulses can be made to correspond to a 3 or more odd multiple of the interval of the first half's 180° RF pulses, it becomes possible to combine the GRASE method with the FSE method. With the GRASE method, a ringing artifact is likely to emerge on an image of a shorter echo time owing to the $T_2$ relaxation of a tissue involved and the GRASE method is used in combination at the latter half portion where a longer echo time is involved.

Figure 9:
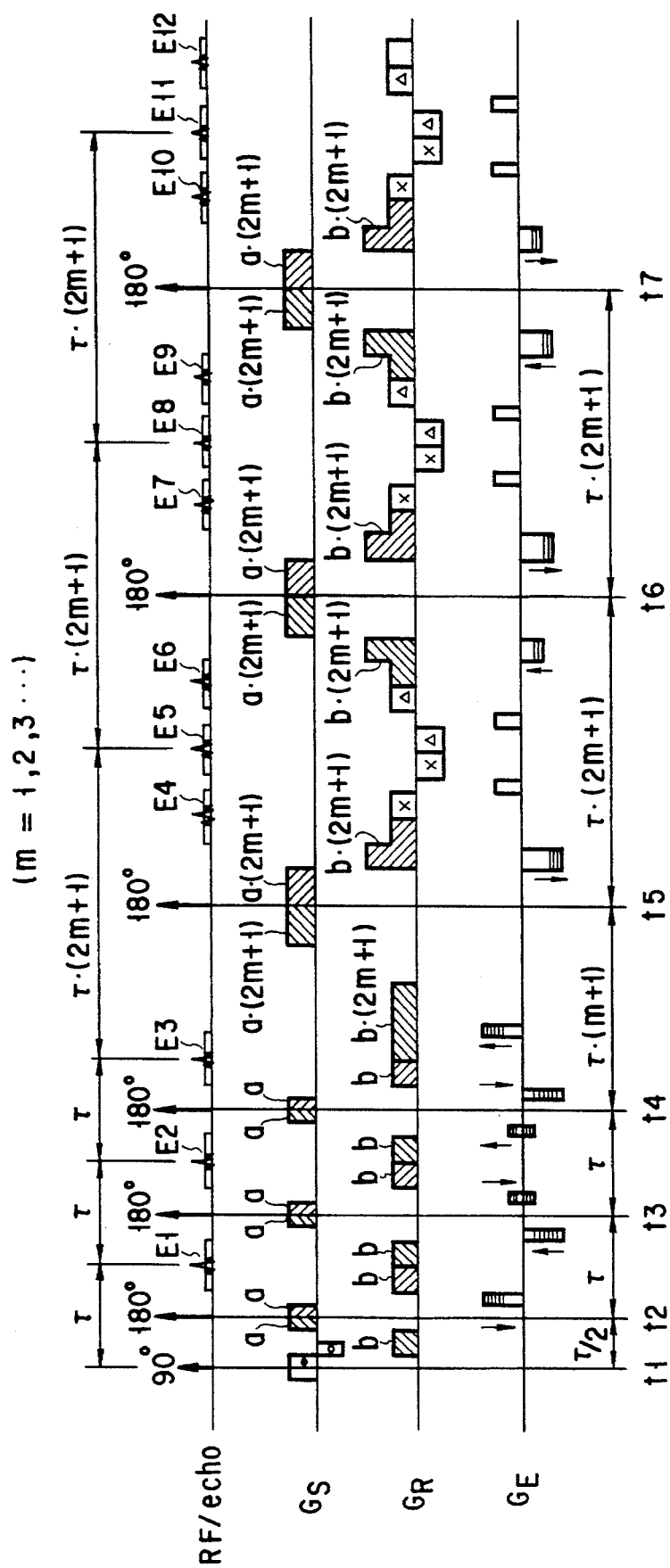
FIG. 9 is a view showing a pulse sequence of an apparatus according to a third embodiment of the present invention.
Figure 10:
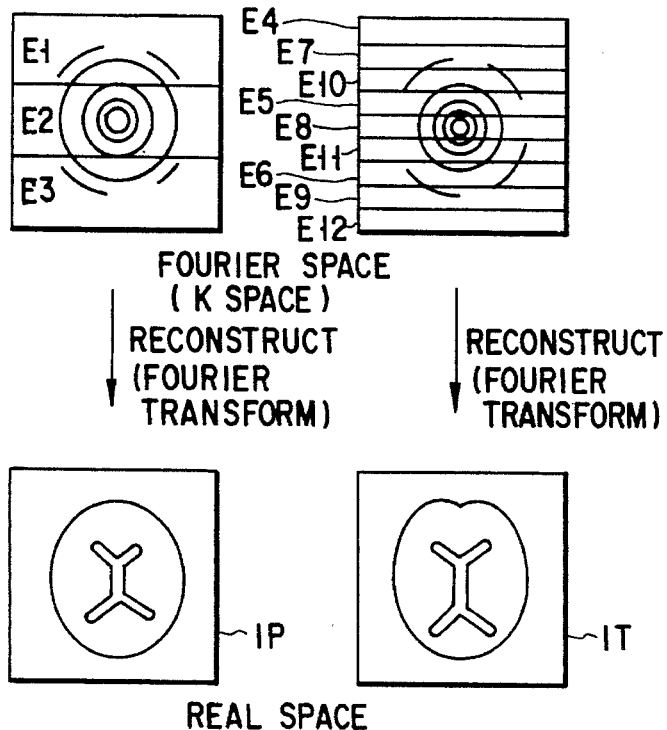
FIG. 10 is a view showing the allocation of echoes to two images to be formed by the apparatus.

FIG. 9 shows a pulse sequence by the third embodiment. Here, as disclosed in FIG. 10, a proton density image IP is formed with the use of first half's echoes E1, E2 and E3 and a T2 enhanced image IT with the use of latter half's echoes E4 . . . E12. As shown in FIG. 10, since the interval of the latter half's 180° RF pulses can be made to correspond to a 3 or more odd multiple (threefold in FIG. 9) of the interval of the first half's 180° RF pulses, the pulse sequence by the GRASE method can be incorporated into the latter half portion and three echoes can be generated between those adjacent 180° RF pulses at the latter half portion while the read gradient magnetic field $G_R$ is reversed twice.

With the interval of the latter half's 180° RF pulses being a 3 or more odd multiple of that of the first half's 180° RF pulses, the slice gradient magnetic field $G_S$ and read gradient magnetic field $G_R$ need to be adjusted as will be set out below. A time integral value of the slice gradient magnetic field GS applied together with the latter half's 180° RF pulses is made to correspond to a 3 or more odd multiple of a time integral value 2 . a, that is, 2 . a . (2m+1), of the slice gradient magnetic field $G_S$ applied together with the first half's 180° RF pulses. Further, a time integral value of the read gradient magnetic field $G_R$ applied between the latter half's adjacent 180° RF pulses is made to correspond to a 2 or more integral multiple of a time integral value 2 . b, that is, 2 . b . (2m+1), of the read gradient magnetic field $G_R$ applied between the first half's adjacent 180° RF pulses.

Thus, it is possible to combine the GRASE method with the FSE method according to the third embodiment. As shown in FIGS. 9 and 10, in view of the situation in which the number of echoes for the first half's proton density image IP provides a large unbalance against the number of echoes for the latter half's T2 enhanced image IT, the number of matriceses and that of averages are varied between the images so that such an unbalance can readily be alleviated. There are sometimes cases where, for the enhancement of a S/N ratio, echoes are repetitively collected at phase encoding so that they are subjected to weight averaging. That average number is called here as an echo number.

(Fourth Embodiment)

Figure 12:
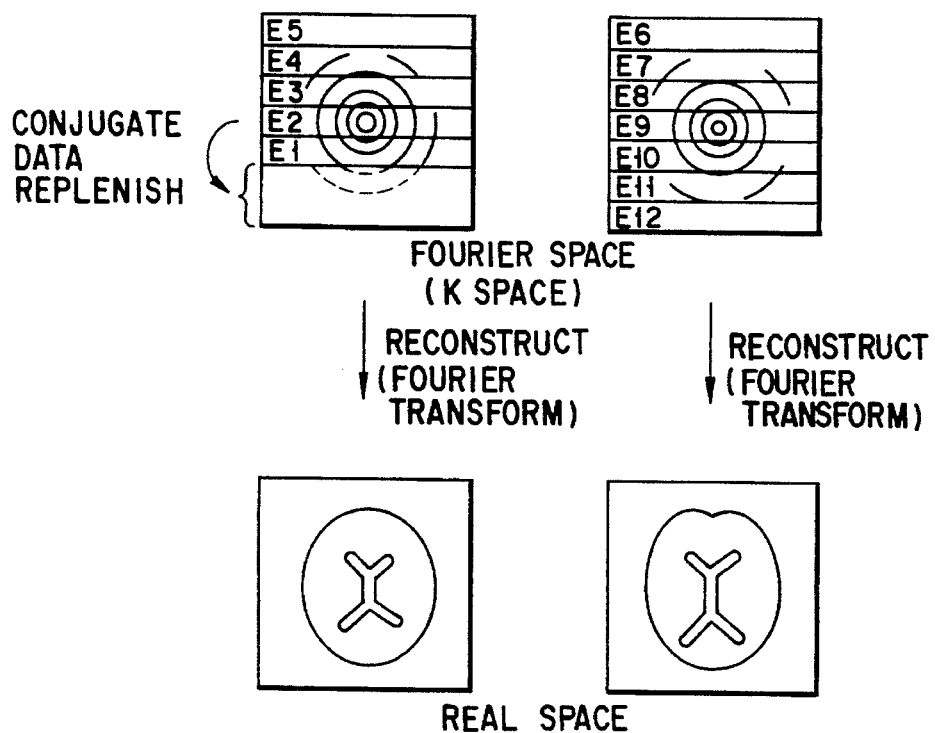
FIG. 12 is a view showing the allocation of echoes to two images to be formed by the apparatus.

The fourth embodiment is similar to the first embodiment in their structures and an explanation as to the arrangement of the apparatus is omitted for brevity's sake. With the fourth embodiment, first half's echoes are collected by an interleaved EPI method, and latter half's echoes by the FSE method, in the dual contrast mode. FIG. 11 shows a pulse sequence of the fourth embodiment and FIG. 12 shows the allocation of echoes to two images. In the interleaved EPI method, echo data are so collected as to place them in an unsymmetrical relation to an encoding direction (Y direction). By so doing, any deficient data is replenished through the utilization of a conjugate complexity to compose a first image IP.

With the fourth embodiment, it is thus possible to increase the number of echoes for the first image.

Various changes or modifications of the present invention can be made without departing from the spirit and scope of the present invention. For example, a 90° RF pulse and 180° RF pulses can change with those of another flipangle. Although the present invention has been explained as being applied, for example, to the fast spin echo method, it may also be applied to a multi-echo imaging method.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A magnetic resonance imaging apparatus comprising:

RF pulse generating means for sequentially generating a plurality of sequential echoes in a sequence by applying a 90° RF pulse for exciting magnetic spins and by sequentially applying a plurality of 180° RF pulses for inverting the phase of the excited magnetic spins; and means for producing an image based on the echoes, said RF pulse generating means generating the 90° and the plurality of the 180° RF pulses at timings such that a plurality of time intervals between the 90° RF pulse and a first echo, and between each adjacent echoes in the sequence, are not all equal, and are each defined as either a shortest time interval thereof or an odd-number multiple of the shortest-time interval thereof.

2. The magnetic resonance imaging apparatus according to claim 1, wherein the time interval between the 90° RF pulse and the first echo is a 3 or more odd multiple of one of the time intervals between the sequentially adjacent echoes.

3. The magnetic resonance imaging apparatus according to claim 2, wherein the time interval between the 90° RF pulse and the first echo is three times as long as the one of the time intervals between the sequentially adjacent echoes.

4. The magnetic resonance imaging apparatus according to claim 2, further comprising:

means for generating a read-out gradient magnetic field to frequency-encode the echoes, wherein a time integral value of a read-out gradient magnetic field generated between the 90° RF pulse and the first echo is a 3 or more odd multiple of a time integral value of a read-out gradient magnetic field generated between two of the sequentially adjacent echoes.

5. The magnetic resonance imaging apparatus according to claim 2, further comprising:

means for generating a slice gradient magnetic field to select a slice, wherein a time integral value of a slice gradient magnetic field generated together with a first 180° RF pulse is a 3 or more odd multiple of time integral value of a slice gradient magnetic field generated together with a subsequent 180° RF pulse.

6. The magnetic resonance imaging apparatus according to claim 1, wherein a time interval between two adjacent echoes is a 3 or more odd multiple of a time interval between two other adjacent echoes.

7. The magnetic resonance imaging apparatus according to claim 6, wherein the time interval between the two adjacent echoes is three times as long as the time interval between the two other adjacent echoes.

8. The magnetic resonance imaging apparatus according to claim 6, further comprising:

means for generating a read-out gradient magnetic field to frequency-encode the echoes, wherein a time integral value of a read-out gradient magnetic field generated between two adjacent echoes is a 3 or more odd multiple of a time integral value of the read-out gradient magnetic field generated between two other adjacent echoes.

9. The magnetic resonance imaging apparatus according to claim 8, further comprising:

means for receiving the echoes, wherein a period of time for receiving one of the echoes is longer than a another period of time for receiving another of the echoes.

10. The magnetic resonance imaging apparatus according to claim 6, further comprising:

means for generating a slice gradient magnetic field to select a slice, wherein a time integral value of a slice gradient field generated together with one of the 180°

RF pulses is a 3 or more odd multiple of a time integral value of a slice gradient magnetic field generated together with another of the 180° RF pulses.

11. The magnetic resonance imaging apparatus according to claim 6, wherein the image forming means forms a first image based on a first set of the echoes and forms a second image based on a second set of the echoes.

12. A magnetic resonance imaging apparatus comprising:

RF pulse generating means for sequentially generating a plurality of sequential echoes in a sequence by applying a 90° RF pulse for exciting magnetic spins and by sequentially applying a plurality of 180° RF pulses for inverting the phase of the excited magnetic spins; and means for producing an image based on the echoes, said RF pulse generating means sequentially generating the plurality of 180° RF pulses in a sequence separated by a plurality of time intervals that are not all equal, each of the plurality of time intervals being defined as either a shortest-time interval of the plurality of time intervals or an integer multiple of the shortest-time interval thereof.

13. The magnetic resonance imaging apparatus according to claim 12, wherein a time interval between a first 180° RF pulse and a second 180° RF pulse is a 2 or more integer multiple of a time interval between two other adjacent subsequent 180° RF pulses.

14. The magnetic resonance imaging apparatus according to claim 13, wherein the time interval between the first 180° RF pulse and the second 180° RF pulse is twice as long as the time interval between the two other adjacent subsequent 180° RF pulses.

15. The magnetic resonance imaging apparatus according to claim 13, further comprising:

means for generating read-out gradient magnetic fields for frequency-encoding the echoes, wherein a time integral value of a read-out gradient magnetic field generated between the 90° RF pulse and a first echo is a 3 or more odd multiple of a time integral value of a read-out gradient magnetic field generated between two of the adjacent echoes.

16. The magnetic resonance imaging apparatus according to claim 13, further comprising:

means for generating slice gradient magnetic fields to select a slice, wherein a time integral value of a slice gradient magnetic field generated together with a first 180° RF pulse is a 3 or more odd multiple of a time integral value of a slice gradient magnetic field generated together with a subsequent 180° RF pulse.

17. The magnetic resonance imaging apparatus according to claim 12, wherein a time interval between two adjacent 180° RF pulses is a 3 or more odd multiple of time interval between two other adjacent 180° RF pulses.

18. The magnetic resonance imaging apparatus according to claim 17, wherein the time interval between the two adjacent 180° RF pulses is three times as long as the the time interval between the two other adjacent 180° RF pulses.

19. The magnetic resonance imaging apparatus according to claim 17, further comprising:

means for generating read-out gradient magnetic fields to frequency-encode the echoes, wherein a time integral value of a read-out gradient magnetic field generated between two adjacent echoes is a 3 or more odd multiple of a time integral value of a read-out gradient magnetic field generated between two other adjacent echoes.

20. The magnetic resonance imaging apparatus according to claim 17, further comprising:

means for receiving the echoes, wherein a period of time for receiving a first set of echoes is longer than another period of time for receiving a second set of echoes.

21. The magnetic resonance imaging apparatus according to claim 17, further comprising:

means for generating a slice gradient magnetic field to select a slice, wherein a time integral value of a slice gradient magnetic field generated together with one of the 180° RF pulses is a 3 or more odd multiple of a time integral value of a slice gradient magnetic field generated together with another of the 180° RF pulses.

22. The magnetic resonance imaging apparatus according to claim 17, wherein the image forming means forms a first image based on a first set of the echoes and forms a second image based on a second set of the echoes.

23. The magnetic resonance imaging apparatus according to claim 17, further comprising:

means for generating a read-out gradient magnetic field, wherein the read-out gradient magnetic field is repeatedly reversed to generate a plurality of echoes between two adjacent 180° RF pulses.

24. The magnetic resonance imaging apparatus according to claim 17, wherein a time interval between two adjacent 180° RF pulses is a 2 or more integer multiple of a time interval between two other adjacent 180° RF pulses.

25. The magnetic resonance imaging apparatus according to claim 24, wherein the time interval between the two adjacent 180° RF pulses are twice as long as the time interval between the two other adjacent 180° RF pulses.

26. The magnetic resonance imaging apparatus according to claim 24, further comprising:

means for generating a read-out gradient magnetic field, wherein the read-out gradient magnetic field is repeatedly reversed to generate a plurality of echoes between two adjacent 180° RF pulses.

27. A magnetic resonance imaging method for exciting magnetic spins and then inverting the phase of the excited magnetic spins to produce a plurality of sequential echoes in a sequence, the method comprising the steps of:

generating a 90° RF pulse; and generating a sequence of 180° RF pulses wherein a plurality time intervals between the 90° RF pulse and a first echo, and between each sequentially adjacent echoes, are not all equal, and are each either a shortest time interval thereof or an odd-number multiple of the shortest-time interval thereof.

28. The method according to claim 27, wherein the time interval between the 90° RF pulse and the first echo is a 3 or more odd multiple of one of the time intervals between the sequentially adjacent echoes.

29. The method according to claim 28, wherein the time interval between the 90° RF pulse and the first echo is three times as long as the one of the time intervals between the sequentially adjacent echoes.

30. The method according to claim 28, further comprising the step of:

generating read-out gradient magnetic fields wherein a time integral value of a read-out gradient magnetic field generated between the 90° RF pulse and the first echo is a 3 or more odd multiple of a time integral value of a read-out gradient magnetic field generated between two of the sequentially adjacent echoes.

31. The method according to claim 28, further comprising the step of:

generating slice gradient magnetic fields wherein a time integral value of a slice gradient magnetic field generated together with a first 180° RF pulse is a 3 or more integer multiple of a time integral value of a slice gradient magnetic field generated together with a subsequent 180° RF pulse.

32. The method according to claim 27, wherein a time interval between two adjacent echoes is a 3 or more odd multiple of a time interval between two other adjacent echoes.

33. The method according to claim 32, wherein the time interval between the two adjacent echoes is three times as long as the time interval between the two other adjacent echoes.

34. The method according to claim 32, further comprising the step of:

generating read-out gradient magnetic fields wherein a time integral value of a read-out gradient magnetic field generated between two adjacent echoes is a 3 or more odd multiple of a time integral value of a read-out gradient magnetic field generated between two other adjacent echoes.

35. The method according to claim 34, wherein a period of time for receiving one of the echoes is longer than another period of time for receiving another of the echoes.

36. The method according to claim 32, further comprising the step of:

generating slice gradient magnetic fields wherein a time integral value of a slice gradient magnetic field generated together with one of the 180° RF pulses is a 3 or more odd multiple of a time integral value of a slice gradient magnetic field generated together with another of the 180° RF pulses.

37. The method according to claim 32, wherein a first image is formed based on a first set of echoes and a second image is formed based on a second set of echoes.

38. A magnetic resonance imaging method for exciting magnetic spins and then inverting the phase of the excited magnetic spins to produce a plurality of sequential echoes, the method comprising the steps of:

generating a 90° RF pulse; and generating a sequence of 180° RF pulses separated by a plurality of time intervals such that each of the plurality of time intervals are defined as either one of a shortest-time interval of the plurality of time intervals or an integer multiple of the shortest-time interval thereof.

39. The method according to claim 38, wherein a time interval between a first 180° RF pulse and a second 180° RF is a 2 or more integer multiple of a time interval between two other adjacent subsequent 180° RF pulses.

40. The method according to claim 39, wherein the time interval between the first 180° RF pulse and the second 180° RF pulse is twice as long as the time interval between the two other adjacent subsequent 180° RF pulses.

41. The method according to claim 39, further comprising the step of:

generating read-out gradient magnetic fields wherein a time integral value of a read-out gradient magnetic value generated between the 90° RF pulse and a first echo is a 3 or more odd multiple of a time integral value of a readout gradient magnetic field generated between two of the adjacent echoes.

42. The method according to claim 39, further comprising the step of:

generating slice gradient magnetic fields wherein a time integral value of a slice gradient magnetic field generated together with the first 180° RF pulse is a 3 or more odd multiple of a slice gradient magnetic field generated together with a subsequent 180° RF pulse.

43. The method according to claim 38, wherein a time interval between two adjacent 180° RF pulses is a 3 or more odd multiple of a time interval between two other adjacent 180° RF pulses.

44. The method according to claim 43, wherein the time interval between the two adjacent 180° RF pulses is three times a long as the time interval between the two other adjacent 180° RF pulses.

45. The method according to claim 43, further comprising the step of:

generating read-out gradient magnetic fields wherein a time integral value of a read-out gradient magnetic field generated between two adjacent echoes is a 3 or more odd multiple of a time integral value of a read-out gradient magnetic field generated between two other adjacent echoes.

46. The method according to claim 43, wherein a period of time for receiving a first set of echoes is longer than a period of time for receiving a second set of echoes.

47. The method according to claim 43, further comprising the step of:

generating slice gradient magnetic fields wherein a time integral value of a slice gradient magnetic field generated together with one of the 180° RF pulses is a 3 or more odd multiple of a time integral value of a slice gradient magnetic field generated together with another of the 180° RF pulses.

48. The method according to claim 43, wherein a first image is formed based on a first set of the echoes and a second image is formed based on a second set of the echoes.

49. The method according to claim 43, further comprising the step of:

generating read-out gradient magnetic fields wherein a read-out gradient magnetic field is repeatedly reversed to generate a plurality of echoes between two adjacent 180° RF pulses.

50. The method according to claim 38, wherein a time interval between two adjacent 180° RF pulses a 2 or more integer multiple of a time interval between two other adjacent 180° RF pulses.

51. The method according to claim 50, wherein the time interval between the two adjacent 180° RF pulses is twice as long as the time interval between the two other adjacent 180° RF pulses.

* * * * *